United States Patent [19]
Asghar et al.

[11] Patent Number: 5,369,791
[45] Date of Patent: Nov. 29, 1994

[54] APPARATUS AND METHOD FOR DISCRIMINATING AND SUPPRESSING NOISE WITHIN AN INCOMING SIGNAL

[75] Inventors: Safdar M. Asghar; John G. Bartkowiak, both of Austin, Tex.

[73] Assignee: Advanced Micro Devices, Inc., Sunnyvale, Calif.

[21] Appl. No.: 887,076

[22] Filed: May 22, 1992

[51] Int. Cl.$^5$ ............................................. H04B 1/10
[52] U.S. Cl. ..................... 455/222; 455/225; 455/296; 375/99; 375/104
[58] Field of Search ............. 455/212, 218, 222, 225, 455/220, 296, 303, 304, 305, 194.1; 375/102, 103, 104, 99

[56] References Cited

U.S. PATENT DOCUMENTS

| | | | |
|---|---|---|---|
| 3,699,463 | 10/1972 | Stone | 375/102 |
| 3,855,423 | 12/1974 | Brendzel et al. | 455/296 |
| 4,074,201 | 2/1978 | Lennon | 455/222 |
| 4,371,981 | 2/1983 | King et al. | 455/222 |
| 4,411,021 | 10/1983 | Yoakum | 455/222 |
| 4,648,126 | 3/1987 | Toffolo | 455/222 |
| 4,648,127 | 3/1987 | Jongepier | 455/222 |
| 4,684,989 | 8/1987 | Roeder et al. | 455/222 |

Primary Examiner—Edward F. Urban
Assistant Examiner—Mark D. Wisler
Attorney, Agent, or Firm—Foley & Lardner

[57] ABSTRACT

An apparatus and method for discriminating and suppressing noise within an incoming signal which provide a first signal processing unit for processing the incoming signal to generate a first iteration signal representing average difference signal level of the incoming signal; a second signal processing unit for processing the first iteration signal to generate a second iteration signal representing specified aspects of the first iteration signal; a prediction unit for generating a predicted value for the second iteration signal from earlier samples of the second iteration signal; a logic unit for determining a threshold difference between the second iteration signal and the predicted value, the logic unit generating a logic output having a first value when the threshold difference exceeds a predetermined threshold value and having a second value when the threshold difference does not exceed the predetermined threshold value; and a muting unit for muting signals which is operatively connected to receive the incoming signal and the logic output, the muting unit responds to the logic output to mute the incoming signal when the logic output is at one value and to not mute the incoming signal when the logic output is at the other value.

16 Claims, 5 Drawing Sheets

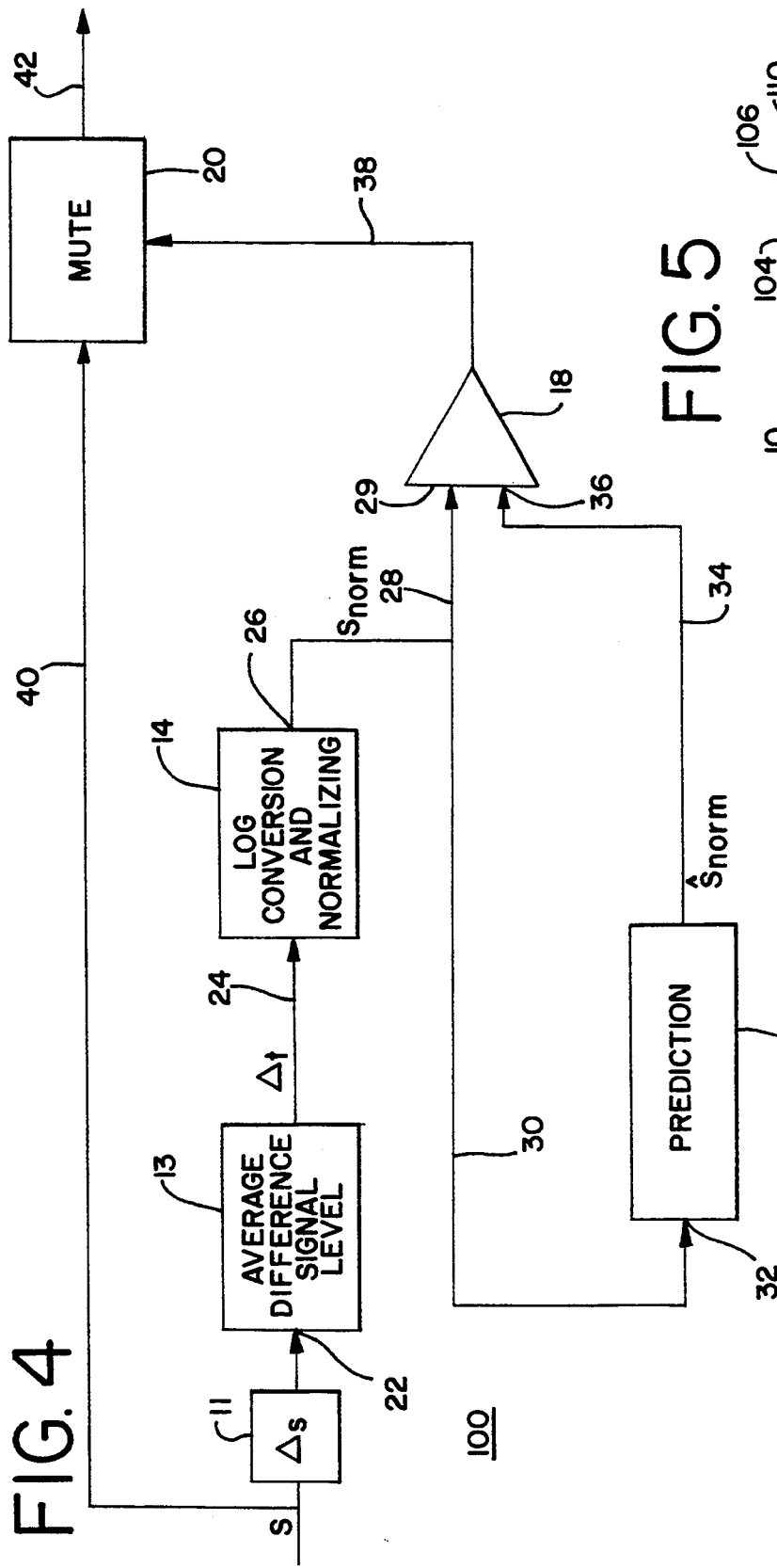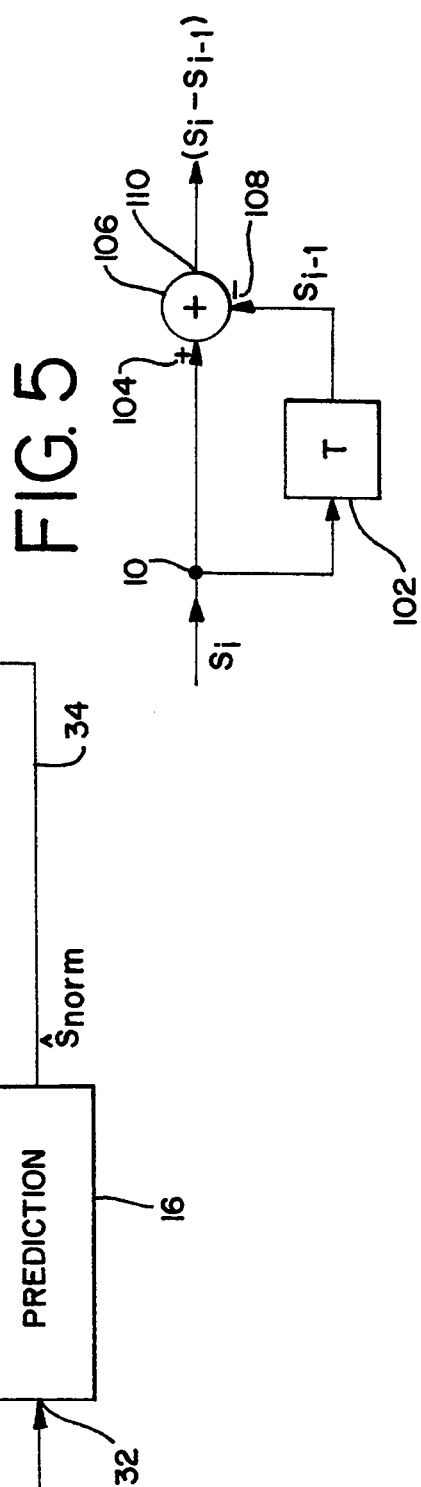

APPARATUS AND METHOD FOR DISCRIMINATING AND SUPPRESSING NOISE WITHIN AN INCOMING SIGNAL

CROSS REFERENCE TO RELATED APPLICATIONS

The following applications contain subject matter similar to the subject matter of this application:

U.S. application Ser. No. 07/887,470, filed May 22, 1992, entitled "Apparatus and Method for Discriminating and Suppressing Noise within an Incoming Signal".

U.S. Pat. No. 5,299,233, issued Mar. 29, 1994, entitled "Apparatus for Attenuating a Received Signal in Response to Presence of Noise".

BACKGROUND OF THE INVENTION

In certain types of communications systems, such as systems employed with wireless telephone systems, information conveyed via analog signalling is received by a receiver in a series of encoded representations of information, generally in the form of a series of "1"'s and "0"'s established via frequency shift keying (FSK) at high frequency. Such transmissions may be subject to reflection such as from buildings and other objects in the transmission path, so there are sometimes radio frequency (RF) signals arriving at a receiver which are time-delayed with respect to other received signals in a manner which may interrupt or distort reception. As a result, the demodulator (or decoder) of the receiver may erroneously convert received signals, thereby becoming unstable and producing interference. Such interference is generally perceived by a user of such a system in the form of popping or clicking sounds or other distracting noises, It is common in the communications industry to compensate for interference or other noise by providing a feedback circuit with a delay whereby one can estimate the noise component of the received signal, generate a duplicate approximation of the noise component, and subtract that approximate noise component from the original signal to eliminate the noise received in the incoming signal. However, an industry standard published for wireless telephones and similar systems requires that no delays be introduced in such systems; i.e., the system must be what is commonly known as a real-time system. Consequently, a solution for eliminating noise in such a system must likewise be a real-time system.

The present invention provides a real-time noise discriminating and suppressing system designed to quickly discriminate and suppress noise in an incoming signal and which will effect muting in a manner which does not prevent understanding received speech when the invention mistakenly triggers on true speech.

SUMMARY OF THE INVENTION

The present invention includes an apparatus for discriminating and suppressing noise within an incoming signal which comprises a first signal processing unit for processing the incoming signal to generate a first iteration signal which represents average signal level, or signal strength, of the incoming signal; a second signal processing unit for processing the first iteration signal to generate a second iteration signal which is representative of specified aspects of the first iteration signal; a prediction unit for generating a predicted value for the second iteration signal from a plurality of earlier samples of the second iteration signal; a logic unit for determining a difference between the second iteration signal and the predicted value, the logic unit generating a logic output having a first value when the difference exceeds a predetermined threshold value and having a second value when the difference does not exceed the predetermined threshold value; and a muting unit for muting signals which is operatively connected to receive the incoming signal and the logic output, the muting unit responds to the logic output to mute the incoming signal when the logic output is at one of the first and second values and responds to the logic output to not mute the incoming signal when the logic output is at the other of the first value and the second value.

A further aspect of the present invention includes a method for discriminating and suppressing noise within an incoming signal which comprises the steps of (1) generating a first iteration signal which is representative of average signal level, or signal strength, of the incoming signal; (2) generating a second iteration signal which is representative of the first iteration signal normalized with respect to a maximum signal level expected of the incoming signal; (3) generating a predicted value for the second iteration signal from a plurality of earlier samples of the second iteration signal; (4) determining a difference between the second iteration signal and the predicted value; (5) generating a control signal which has a first value when the difference exceeds a predetermined threshold value and has a second value when the difference does not exceed the predetermined threshold value; and (6) providing a muting unit for muting signals which is operatively connected to receive the incoming signal and the control signal and responds to the control signal to mute the incoming signal when the control signal is at one of the first and second values and to not mute the incoming signal when the control signal is at the other of the first and second values.

It is, therefore, an object of the present invention to provide a method and apparatus for discriminating and suppressing noise within an incoming signal which efficiently and accurately identifies and discriminates noise within an incoming signal and mutes that noise.

Further objects and features of the present invention will be apparent from the following specification and claims when considered in connection with the accompanying drawings illustrating the preferred embodiment of the invention.

DETAILED DESCRIPTION OF THE DRAWINGS

FIG. 4 is a schematic block diagram of the preferred embodiment of the present invention.

FIG. 5 is a schematic block diagram of details of a representative device suitable for use as the signal difference sampling unit of the preferred embodiment of the present invention illustrated in FIG. 4.

DETAILED DESCRIPTION OF THE INVENTION

Figure 1:
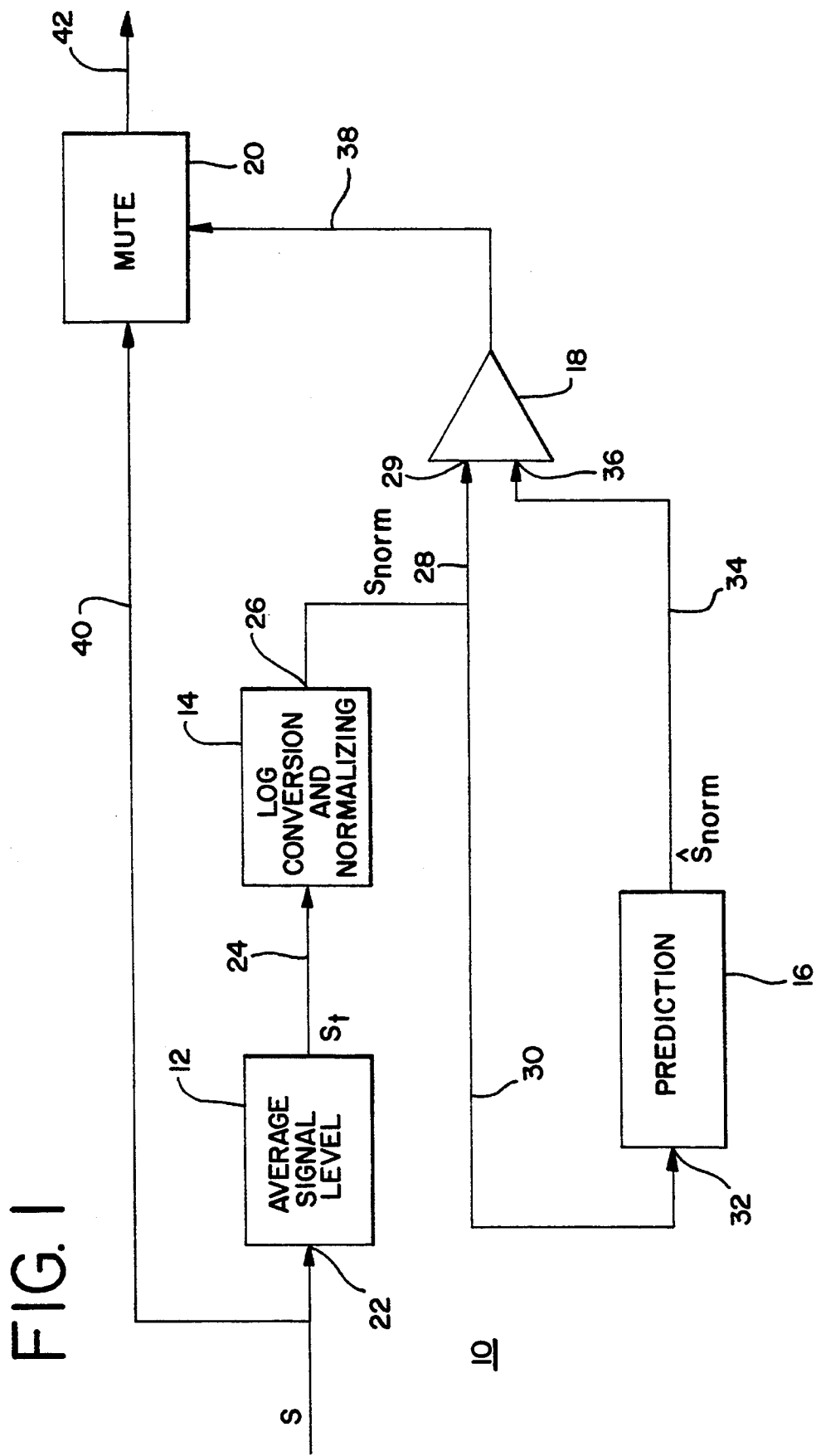
FIG. 1 is a schematic block diagram of an alternate embodiment of the apparatus of the present invention.

FIG. 1 is a schematic block diagram of an alternate embodiment of the apparatus of the present invention. In FIG. 1, an apparatus 10 for discriminating and suppressing noise within an incoming signal is illustrated as including an signal level averaging unit 12, a log conversion and normalizing unit 14, a prediction unit 16, a comparator unit 18, and a muting unit 20.

Apparatus 10 may be employed in a wireless phone system (i.e., a phone system having no cord connecting the phone receiver and a base unit, the base unit being configured to receive telephone signals by wire or other means). In such wireless telephone systems, the input speech received at an input 22 of signal level averaging unit 12 is already band limited to four KHz prior to reception by the receiving system. This input speech can be received from other sources in other systems, such as recording machines, and may be in linear format or in compressed form having been compressed according to any of several compression algorithms. Speech which is in compressed form [e.g., pulse code modulated (PCM), adaptive differential pulse code modulation (ADPCM), differential pulse code modulation (DCPM), or the like] passes through a normal decoder for the appropriate respective coding system and is then introduced into the audio receiver as linear data. Noise detection preferably occurs after the received signal is decoded. No delay need be introduced into the receiving system if such delay is critical to performance (or if industry standards preclude any delay). However, if a small amount of delay is used, the early part of a noisy passage of signal can be removed which improves performance.

An incoming signal s is received from the output of a signal decoder (not shown in FIG. 1) by signal level averaging unit 12 at input 22. Signal level averaging unit 12 calculates an average signal level $\delta_t$, according to the relationship:

$$\delta_t = \frac{1}{n} \sum_{i=1}^{n} |s_i| \qquad \text{[Eq. 1]}$$

where
$\delta_t$ = average signal level,
$|s_i|$ = absolute value of the signal level of the $i^{th}$ sample of the incoming signal s, and
n = number of samples.

Signal level averaging unit 12 averages the absolute value of incoming signal s over n samples at a sampling rate of 8 KHz.

During normal speech, the output of signal level averaging unit 12 varies slowly so that its output can be predicted accurately. However, when incoming signal s is noisy, large errors occur in the prediction of average signal level $\delta hd\ t$. Such presence of noise in incoming signal s can thus be detected whenever the inverse of prediction error is less than a predetermined threshold level (or, conversely, whenever prediction error is greater than a predetermined threshold level). The choice of threshold level can affect the performance of apparatus 10 because, if the threshold is set too high, apparatus 10 triggers on true speech, and if the threshold is set too low, noise can be missed.

Signal level averaging unit 12 provides its output 6t to log conversion and normalizing unit 14 via a line 24. Average signal level $\delta_t$ is provided to log conversion and normalizing unit 14 via a line 24. Incoming signal s is preferably received as a series of "1"'s and "0"'s in the form of a frequency shift keyed (FSK) signal, converted to linear data by a decoder before input to signal level averaging unit 12.

Log conversion and normalizing unit 14 performs a conversion of average signal level $\delta_t$, according to the known relationship:

$$S_{norm} = 10 \log_{10}\left(\frac{\delta_t}{\delta_{max}}\right) \qquad \text{[Eq. 2]}$$

where
$S_{norm}$ = average signal level normalized with respect to maximum signal level,
$\delta_t$ = average signal level, and
$\delta_{max}$ = maximum expected signal level.

Thus, log conversion and normalizing unit 14 provides at an output 26 the quantity $S_{norm}$ (expressed in decibels (db)) representing average signal level $\delta_t$ normalized with respect to maximum signal level $\delta_{max}$ expected to be received by apparatus 10. Preferably, $\delta_{max}$32 8192.

The implementations of Equations (1) and (2) are preferably simplified for use in a binary arithmetic system and it is desirable that the division functions be removed for convenience, efficiency, and speed in calculation.

Each incoming signal sample $s_i$ is a 16-bit 2's complement number arranged in a format shown below where the arithmetic mask is 19-bit:

| Bit No. | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| | | | | S | 15 | 14 | 13 | 12 | 11 | 10 | 9 | 8 | 7 | 6 | 5 | 4 | 3 | 2 | 1 | where "S" is the sign bit and there are 15 magnitude bits, "bits 15–1".

Equation (1) requires that the "modulus", or absolute value, of the signal level, or signal strength, of each incoming signal sample $s_i$ be generated and added to the previous (n−1) samples of $|s_i|$. The value of n is preferably chosen to be 8 since it represents $2^3$ and is therefore easily handled by a binary number system. Eight samples can be accumulated in an arithmetic logic unit (ALU) in the number format shown above without overflow, and an averaging filter which accommodates n=8 has demonstrated good performance in fulfilling the requirements of signal level averaging unit 12.

Thus, when average signal level $\delta_t$ is finally accumulated, it resides in an ALU in the following accumulated format:

Bit No. 18 17 16 15 14 13 12 11 10 9  8 7 6 5 4 3 2 1 0
       S  18 17 16 15 14 13 12 11 10 9 8 7 6 5 4 3 2 1

|———————— most significant 16 bits ————————|

Equation (2) may be simplified to express $S_{norm}$ in a base 2 logarithm format for more straightforward treatment using a binary system in the form of Equation (3) as shown below:

$$S_{norm} = 10\log_{10}\frac{\delta_t}{\delta_{max}} = K(\log_2\delta_t - \log_2\delta_{max}), \quad [\text{Eq. 3}]$$

$$\text{where } K = 10\log_{10}2$$

$$= K(\log_2\delta_t - K_1),$$

$$\text{where } K_1 = \log_2\delta_{max}$$

$\delta_{max}$ is preferably chosen as $8192=2^{13}$, since in this exemplary system 8192 is the maximum signal level expected in a normal decoder output. Any signal in excess of 8192 is, thus, treated as an overloaded signal (i.e., saturated speech input or noise).

Equation (3) simplifies the operation of apparatus 10, especially since it avoids division. K is a scaling factor, which can be ignored, and $K_1$ is a constant which may be prestored and, therefore, does not require calculation. The most significant 16 bits of the ALU in the accumulated format described above are applied to $\log_2$ hardware (which is available as a known circuit block); the output of the $\log_2$ hardware is an 11-bit plus implied positive sign (12-bit) value stored in a 12-bit format as shown below:

```
Bit No. 18 17 16 15 14 13 12 11 10 9 8 7 6 5 4 3 2 1 0
         0  X  X  X  X  X  X  X  X  X X X X 0 0 0 0
            |_____|
                most significant 16 bits
              Output of log2 Hardware circuit
```

This $\log_2$ value is a signed, 4-bit exponent, 7-bit mantissa parameter where the 4-bit exponent represents the position of the most significant "1" in the 16-bit value $\delta_t$.

The prestored constant $K_i$ may then be subtracted from the output $\delta_t$ of signal level averaging unit 12 by log conversion and normalizing unit 14 to generate normalized average signal level $S_{norm}$.

Normalized average signal level $S_{norm}$ is conveyed via a line 28 to a first input 29 of comparator unit 18, and is conveyed via a line 30 to an input 32 of prediction unit 16.

The predicted value of the normalized average signal level $\hat{S}_{norm}$ is determined according to the relationship:

$$\hat{S}_{norm} = \sum_{i=1}^{m} \gamma_i S_{norm}^{t-i} \quad [\text{Eq. 4}]$$

where m=4 and $Y_i$ are predefined constants. The four past scaled values of $S_{norm}$ are represented by $Y_i S_{norm}^{t-i}$ and are accumulated in prediction unit 16. Equation (4) may be executed employing an 8 ×16-bit parallel multiplier where the most significant 16-bits of the $S_{norm}$ parameter (in the 12-bit format described above) are applied to the 16-bit input of the multiplier and the $Y_i$ parameters are (prestored as 8-bit signed coefficients) applied to the 8-bit input of the multiplier. The output of the multiplier is preferably in the 12-bit format described above (and in $\log_2$ format).

Prediction unit 16 conveys the value of $\hat{S}_{norm}$ via a line 34 to a second input 36 of comparator unit 18. The apparatus by which prediction unit 16 calculates the value $\hat{S}_{norm}$ will be discussed in greater detail hereinafter in connection with FIG. 3.

Comparator unit 18 calculates a prediction error parameter $E_t$, preferably in decibels (db), according to the relationship:

$$E_t = 10\log_{10}\frac{(S_{norm})^2}{(S_{norm} - \hat{S}_{norm})^2} \quad [\text{Eq. 5}]$$

This may be simplified to:

$$E_t = K_2(\log_2 S_{norm} - \log_2[S_{norm} - \hat{S}_{norm}]) \quad [\text{Eq. 6}]$$

Execution of Equation (6) requires only two subtractions and two $\log_2$ functions, thus simplifying execution of Equation (6) by eliminating any division operations. $K_2 = 20\log_{10}2$, and is a constant which can be ignored in the preferred exemplary implementation.

$E_t$ is compared with a predetermined threshold, for example 8 db, so that if $E_t$ exceeds the predetermined threshold, it is assumed that incoming signal s contains speech information, and if $E_t$ is less than the predetermined threshold, it is assumed that incoming signal s contains noise. Thus, muting unit 20 receives a logic output representing a comparison of $E_t$ with the predetermined threshold via a line 38 from comparator unit 18. Muting unit 20 also receives incoming signal s via a line 40. Muting unit 20 responds to the logic output signal received on line 38 to effect muting on incoming signal s received via line 40 when the logic output signal received via line 38 indicates that incoming signal s contains noise; i.e., when $E_t$ is less than the predetermined threshold. Similarly, muting unit 20 effects no muting of incoming signal s when the logic output signal received via line 38 indicates that incoming signal s contains speech information; i.e., when $E_t$ exceeds the predetermined threshold. Muting unit 20 provides an output signal on a line 42, which output signal is either a muted or non-muted signal, depending upon the value of the logic output signal received by muting unit 20 via line 38 from comparator unit 18.

Thus, apparatus 10 performs a noise discriminating function and a noise suppressing function. When apparatus 10 determines that incoming signal s contains noise, it effects muting of incoming signal s until it is later determined that incoming signal s contains speech information, at which time muting of incoming signal s may be discontinued. Alternatively, muting may be effected for a predetermined muting period (e.g., 256 clock cycles) on each occasion of noise detection, and a recheck for presence of noise may be conducted after each such muting period expires to determine anew whether to impose muting for a succeeding muting period.

Apparatus 10 is based upon a signal level prediction and upon an assumption that during normal speech the average signal level varies relatively slowly but channel noise often causes the decoder (from which incoming signal s is received by apparatus 10) to become unstable resulting in a large increase in decoded signal level in a much shorter time than is experienced when incoming signal s contains speech information. It is this rapid and large increase in level which is perceived as unpleasant clicks or pops by a user.

During normal speech, the relatively slowly-varying signal level of incoming signal s can be predicted relatively accurately. However, when the decoder becomes unstable (as when noise is present) this signal is not predictable and results in a large error in the predictor output. Apparatus 10 detects the onset of a noise burst whenever the prediction error parameter $E_t$ is less than a predetermined threshold. The choice of the threshold directly affects performance and responsiveness of the system, and is generally determined empirically.

Instead of relying upon a predetermined muting period to effect noise reduction, it may be advantageous to detect the termination of a noise burst, a burst end, to determine when to cease muting. To detect a burst end, apparatus 10 may track the slope of a quantizer step size which is calculated simply as the average difference of signal level (or another parameter related to signal level) over some interval. This slope is compared to a threshold and, if the slope is more negative than the threshold, then the end of an error burst is determined to have occurred. Once such a burst end is detected, muting may be terminated or may be continued for a short interval in order to ensure full recovery of the decoder before discontinuing muting. The optimum interval for such extended muting is preferably determined empirically.

Figure 2:
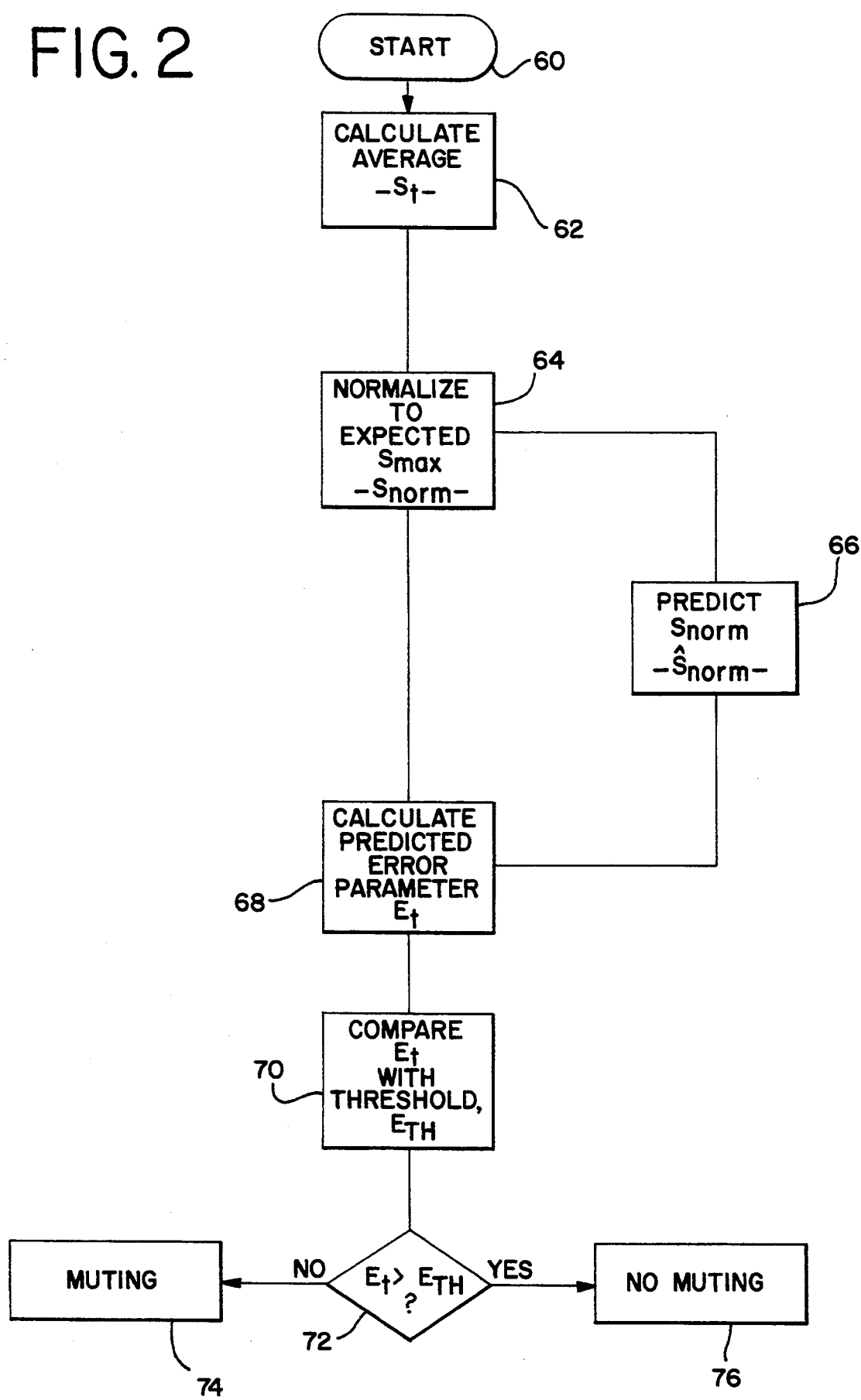
FIG. 2 is a flow diagram illustrating an alternate embodiment of the method of the present invention.

FIG. 2 is a flow diagram illustrating an alternate embodiment of the method of the present invention. In FIG. 2, the method starts at a block 60 with reception of incoming signal s (see FIG. 1), and average signal level $\delta_t$ is calculated (Block 62) as a function of incoming signal level s, according to the relationship:

$$\delta_t = \frac{1}{n} \sum_{i=1}^{n} |s_i| \qquad [\text{Eq. 7}]$$

where $\delta_t$ = average signal level, $|s_i|$ = absolute value of the signal level of the $i^{th}$ sample of the incoming signal s, and n = number of samples.

Then there is calculated (Block 64) a normalized average signal level $S_{norm}$, according to the relationship:

$$S_{norm} = 10\log_{10}\left(\frac{\delta_t}{\delta_{max}}\right) \qquad [\text{Eq. 8}]$$

$$= K(\log_2 \delta_t - K_1)$$

where $S_{norm}$ = average signal level normalized with respect to maximum signal level, $\delta_t$ = average signal level, $\delta_{max}$ = maximum expected signal level, $K = 10\log_{10}2$, and $K_1 = \log_2 \delta_{max}$.

A predicted value of the normalized average signal level $\hat{S}_{norm}$ is calculated (Block 66), according to the following relationship:

$$\hat{S}_{norm} = \sum_{i=1}^{m} \gamma_i S_{norm}^{t-i} \qquad [\text{Eq. 9}]$$

where $\hat{S}_{norm}$ = predicted average signal level normalized to maximum expected signal level of said incoming signal, $\gamma_i$ = a scaling factor, $S_{norm}^{t-i}$ = $i^{th}$ past sample of normalized average signal level, and m = number of samples.

In the preferred embodiment, it has been found sufficient for the needs of a wireless telephone application to employ a value of 4 for the number of samples m, and to employ predetermined constants for the values of scaling factors $\gamma_i$.

A prediction error parameter $E_t$ is calculated, preferably according to the expression:

$$E_t = 10\log_{10}\frac{S_{norm}^2}{(S_{norm} - \hat{S}_{norm})^2} \qquad [\text{Eq. 10}]$$

$$= K_2(\log_2 S_{norm} - \log_2 [S_{norm} - \hat{S}_{norm}])$$

where $K_2 = 20\log_{10}2$.

$E_t$ is compared with a predetermined threshold value (Block 70) to generate a logic output signal reflecting that comparison; the logic output value has a first value when $E_t$ exceeds the predetermined threshold value, thereby indicating the presence of speech in incoming signal s; and the logic output signal has a second value when $E_t$ is less than the predetermined threshold, thereby indicating the presence of noise in incoming signal s (Block 72). Thus, incoming signal s is muted by a muting device when the logic output signal indicates the presence of noise in incoming signal s (Block 74). When the logic output signal indicates the presence of speech in incoming signal s, the muting device effects no muting of incoming signal s (Block 76).

Figure 3:
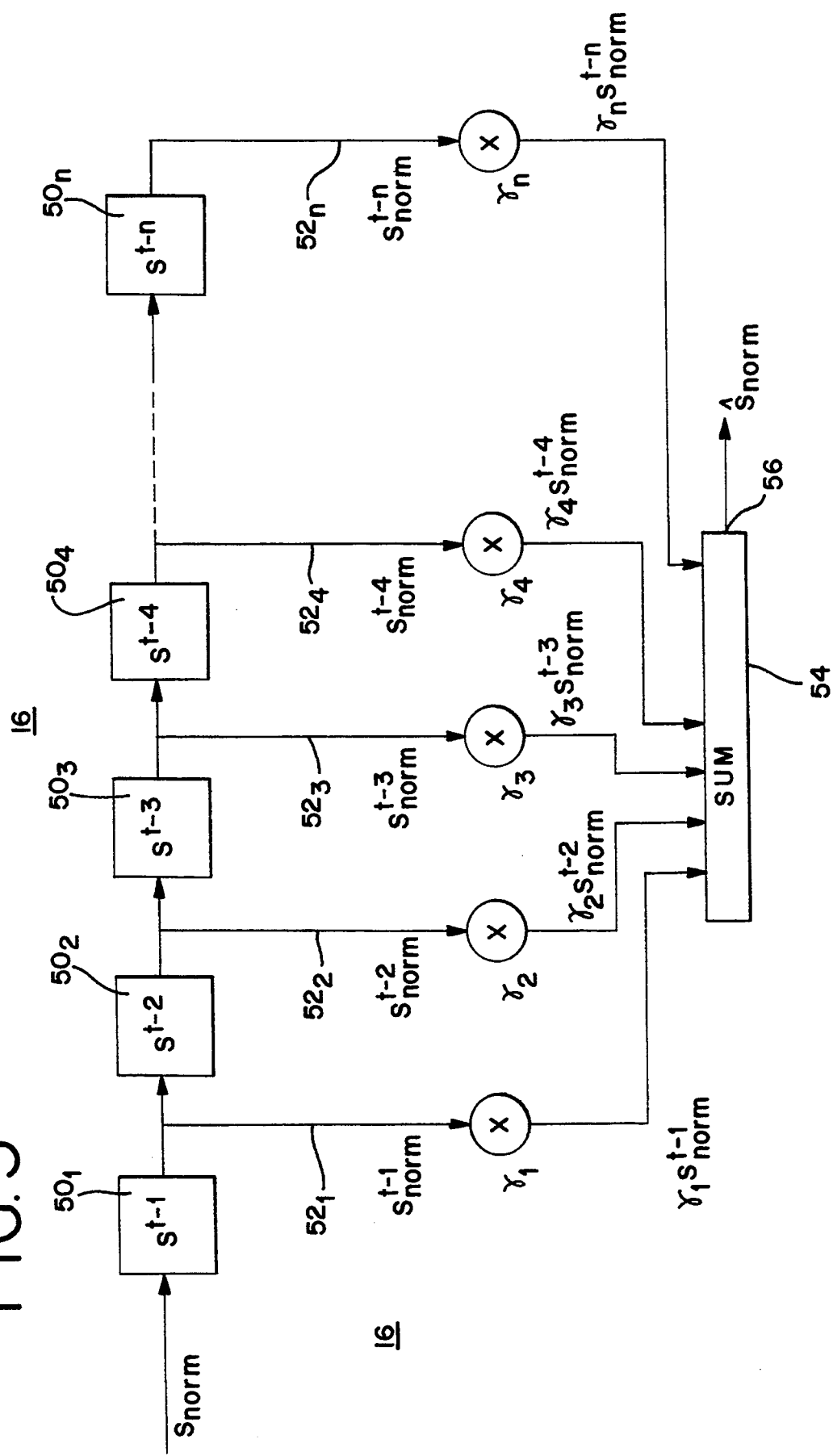
FIG. 3 is a schematic block diagram of a representative embodiment of the prediction unit of the present invention.

FIG. 3 is a schematic block diagram of a representative embodiment of the prediction unit of the present invention. In FIG. 3, a prediction unit 16 is illustrated as a multi-stage digital filter comprising a plurality of delay units $50_1$, $50_2$, $50_3$, $50_4$, ... $50_n$. Each delay unit $50_i$ delays the received signal $S_{norm}$ (normalized average signal level) by an additional time period so that an output line $52_1$ conveys the received signal delayed one time period, $S_{norm}^{t-1}$; output line $52_2$ conveys the received signal delayed by two time periods, $S_{norm}^{t-2}$; output line $52_3$ conveys the received signal delayed three time units, $S_{norm}^{t-3}$; output line $52_4$ conveys the received signal delayed by four time units, $S_{norm}^{t-4}$; and output line $52_n$ conveys the received signal delayed by n time units, $S_{norm}^{t-n}$.

Each of the respective output signals $S_{norm}^{t-i}$ conveyed by output lines $52_i$ are respectively multiplied by a scaling factor $\gamma_i$ so that output signal $S_{norm}^{t-1}$ is multiplied by scaling factor $\gamma_1$, output signal $S_{norm}^{t-1}$ is multiplied by scaling factor $\gamma_2$, output signal $S_{norm}^{t-3}$ is multiplied by scaling factor $\gamma_3$, output signal $S_{norm}^{t-4}$ is multiplied by scaling factor $\gamma_4$, and output signal $S_{norm}^{t-n}$ is multiplied by scaling factor $\gamma_n$. The resultant scaled output signals $\gamma_i S_{norm}^{t-i}$ are summed in a summer 54 which provides at an output 56 a predicted value $\hat{S}_{norm}$ for normalized average signal level $S_{norm}$ based upon a plurality of earlier samples $S_{norm}^{t-i}$ of $S_{norm}$.

For purposes of clarity and ease in understanding the present invention, like elements will be identified by like reference numerals in the various drawings.

FIG. 4 is a schematic block diagram of the preferred embodiment of the present invention. In FIG. 4, an incoming signal s is received by an apparatus 100 from the output of a signal decoder (not shown in FIG. 4) by a signal difference sampling unit 11.

Signal difference sampling unit 11 provides an output which represents the difference between a current sample of incoming signal s with a previous sample of incoming signal s. When incoming signal s is sampled at regular intervals (i.e., at a constant sampling rate), then the difference output generated by difference sampling unit 11 is directly related to the rate of change, or slope, of the signal level of incoming signal s at each sampling. This rate of change of signal level is particularly useful in discriminating noise from communications signals, especially speech signals, since the slope of noise signals is significantly different from the slope of speech signals. Noise signals are very easily and, more important, very quickly distinguishable from speech signals by their slope. The difference signal output may, for example, be determined by an arrangement such as the device illustrated in FIG. 5.

FIG. 5 is a schematic block diagram of details of a representative device suitable for use as the signal difference sampling unit of the preferred embodiment of the present invention illustrated in FIG. 4. In FIG. 5, an incoming signal sample $s_i$ is received at a juncture 101. Signal sample $s_i$ is applied to a delay unit 102 and to the positive node 104 of a summer 106. Delay unit 102 generates a delayed (preferably a 1-sample delay) signal sample $s_{i-1}$, and delayed signal sample $s_{i-1}$ is applied to a negative node 108 of summer 106. Summer 106 generates at an output 110 a difference signal $s_i - S_{i-1}$. Difference signal $s_i - S_{i-1}$ is received by signal difference level averaging unit 13 at input 22 (FIG. 4). Signal difference level averaging unit 13 calculates an average difference signal level $\Delta$, preferably according to the relationship:

$$\Delta_t = \frac{1}{n} \sum_{i=1}^{n} |s_i - s_{i-1}| \quad [\text{Eq. 11}]$$

where $\Delta_t$ = average difference signal level, $|s_i - s_{i-1}|$ = absolute value of the difference between the signal level of the $i^{th}$ sample of the incoming signal s and the $(i-1)^{th}$ sample of the incoming signals, and n = number of samples.

Signal difference level averaging unit 13 preferably averages the absolute value of difference signal level $(s_i - s_{i-1})$ over n samples at a sampling rate of 8 KHz.

During normal speech, the output of signal difference level averaging unit 13 varies slowly so that its output can be predicted accurately. However, when incoming signal s is noisy, large errors occur in the prediction of average difference signal level $\Delta$. Such presence of noise in incoming signal s can thus be detected whenever the inverse of prediction error is less than a predetermined threshold level (or, conversely, whenever prediction error is greater than a predetermined threshold level).

Returning to FIG. 4, signal difference level averaging unit 13 provides its output $\Delta_t$ to log conversion and normalizing unit 14 via a line 24. Average signal level $\Delta_t$ is provided to log conversion and normalizing unit 14 via a line 24. Incoming signal s is preferably received as a series of "1"'s and "0"'s in the form of a frequency shift keyed (FSK) signal, converted to linear data by a decoder before input to signal difference sampling unit 11.

Log conversion and normalizing unit 14 performs a conversion of average difference signal level $\Delta_t$, preferably according to the known relationship:

$$\Delta S_{norm} = 10\log_{10}\left(\frac{\Delta_t}{\Delta_{max}}\right) \quad [\text{Eq. 12}]$$

where $\Delta S_{norm}$ = average difference signal level normalized difference with respect to maximum signal level, $\Delta_t$ = average difference signal level, and $\Delta_{max}$ = maximum expected difference signal level.

Thus, log conversion and normalizing unit 14 provides at an output 26 the quantity $\Delta S_{norm}$ (expressed in decibels (db)) representing average difference signal level $\Delta_{max}$ normalized with respect to maximum difference signal level $\Delta$ expected to be received by apparatus 100.

The implementations of Equations (11) and (12) are preferably simplified for use in a binary arithmetic system and it is desirable that the division functions be removed for convenience, efficiency, and speed in calculation. Equation (12) may be simplified to express $\Delta S_{norm}$ in a base 2 logarithm format for more straightforward treatment using a binary system in the form of Equation (13) as shown below:

$$\Delta S_{norm} = 10\log_{10}\frac{\Delta_t}{\Delta_{max}} = K(\log_2\Delta_t - \log_2\Delta_{max}), \quad [\text{Eq. 13}]$$

$$\text{where } K = 10\log_{10}2$$

$$= K(\log_2\Delta_t - K_1),$$

$$\text{where } K_1 = \log_2\Delta_{max}$$

Equation (13) simplifies the operation of apparatus 100, especially since it avoids division. K is a scaling factor, which can be ignored, and $K_1$ is a constant which may De prestored and, therefore, does not require calculation.

The prestored constant $K_1$ may be subtracted from the output $\Delta_t$ of signal difference level averaging unit 13 binary log conversion and normalizing unit 14 to generate normalized average difference signal level $\Delta S_{norm}$.

Normalized average difference signal level $\Delta S_{norm}$ is conveyed via a line 28 to a first input 29 of comparator unit 18, and is conveyed via a line 30 to an input 32 of prediction unit 16.

The predicted value of the normalized average difference signal level $\Delta \hat{S}_{norm}$ is preferably determined according to the relationship:

$$\Delta \hat{S}_{norm} = \sum_{i=1}^{m} \gamma_i \Delta S_{norm}^{t-i} \quad [\text{Eq. 14}]$$

where m = 4 and $Y_i$ are predefined constants. The four past scaled values of $\Delta S_{norm}$ are represented by $Y_i \Delta_{norm}^{t-i}$ and are accumulated in prediction unit 16. Equation (14) may be executed employing an 8×16 -bit parallel multiplier where the most significant 16 -bits of the $\Delta S_{norm}$ parameter (in the 12-bit format described above) are applied to the 16 -bit input of the multiplier and the $Y_i$ parameters are (prestored as 8-bit signed coefficients) applied to the 8-bit input of the multiplier. The output of the multiplier is preferably in the 12 -bit format described above (and in $\log_2$ format).

Prediction unit 16 conveys the value of $\Delta \hat{S}_{norm}$ via a line 34 to a second input 36 of comparator unit 18. The apparatus by which prediction unit 16 calculates the value $\Delta \hat{S}_{norm}$ was discussed in connection with FIG. 3.

Comparator unit 18 calculates a prediction error parameter $E_t$, preferably in decibels (db), according to the relationship:

$$E_t = 10\log_{10} \frac{(\Delta S_{norm})^2}{(\Delta S_{norm} - \Delta \hat{S}_{norm})^2} \qquad \text{[Eq. 15]}$$

This may be simplified to:

$$E_t = K_2(\log_2 \Delta S_{norm} - \log_2[\Delta \hat{S}_{norm}]) \qquad \text{[Eq. 16]}$$

Execution of Equation (16) requires only two subtractions and two $\log_2$ functions, thus simplifying execution of Equation (16) by eliminating any division operations. $K_2 = 20\log_{10}2$, and is a constant which can be ignored in the preferred exemplary implementation.

The remainder of the preferred embodiment of the present invention is constructed and operates in substantially the same manner as has been previously described in connection with FIGS. 1-3.

Figure 6:
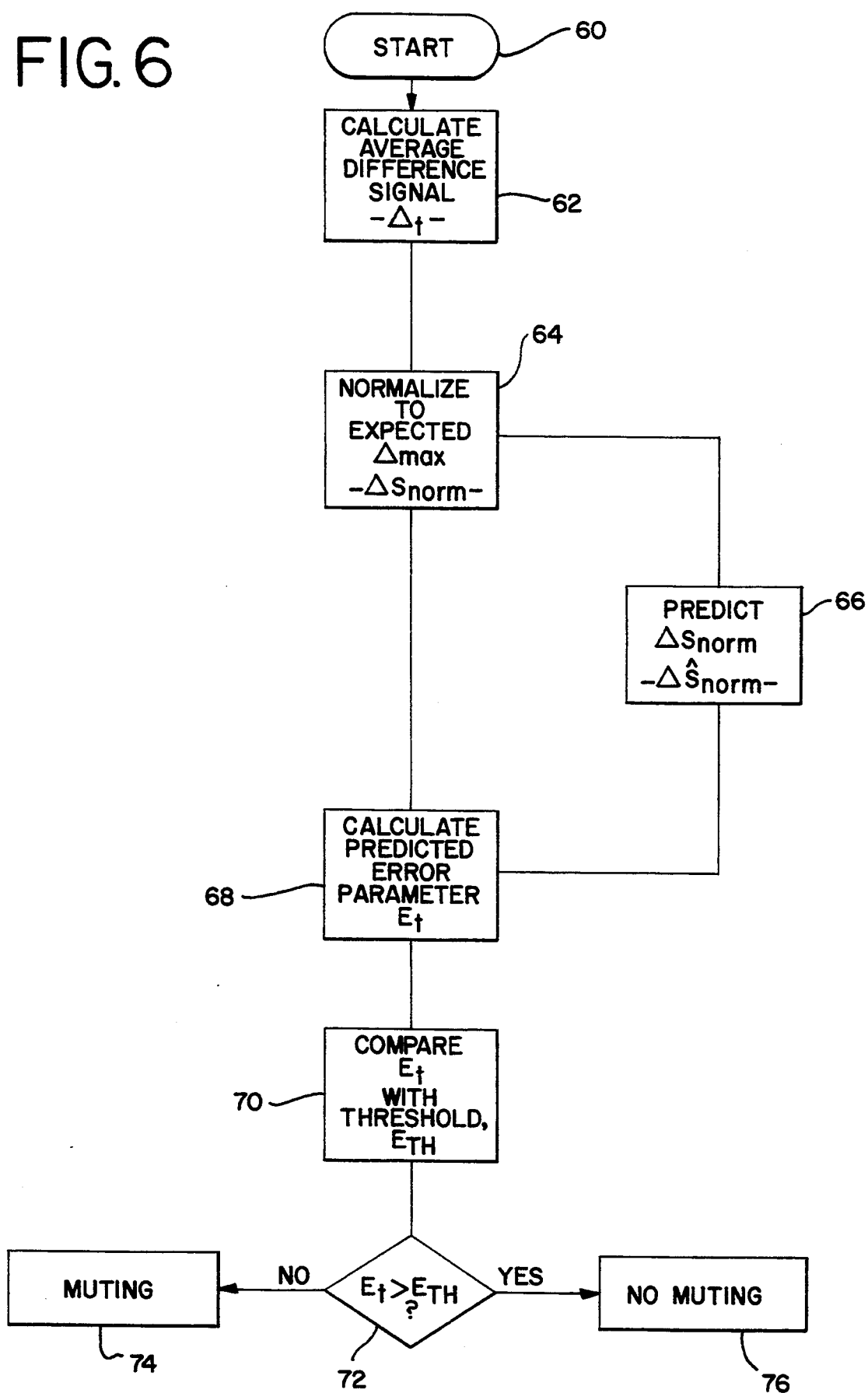
FIG. 6 is a flow diagram illustrating the preferred embodiment of the method of the present invention.

FIG. 6 is a flow diagram illustrating the preferred embodiment of the method of the present invention. In FIG. 6, the method starts at a block 60 with reception of incoming signal s (see FIG. 5), and average difference signal level $\Delta_t$ is calculated (Block 62) as a function of incoming signal level s, according to the relationship:

$$\Delta_t = \frac{1}{n} \sum_{i=1}^{n} |s_i - s_{i-1}| \qquad \text{[Eq. 17]}$$

where $\Delta_t$ = average difference signal level, $|s_i -|$ = absolute value of the difference between the signal level of the $i^{th}$ sample of the incoming signal s and the $(i-1)^{th}$ sample of the incoming signals, and n = number of samples.

Then there is calculated (Block 64) a normalized average difference signal level $\Delta S_{norm}$, preferably according to the relationship:

$$\Delta S_{norm} = 10\log_{10}\left(\frac{\Delta_t}{\Delta_{max}}\right) \qquad \text{[Eq. 18]}$$
$$= K(\log_2 \Delta_t - K_1)$$

where $\Delta S_{norm}$ = average difference signal level normalized with respect to maximum signal level, $\Delta_t$ average difference signal level, $\Delta_{max}$ = maximum expected difference signal level, $K = 10\log_{10}2$, and $K_1 = \log_2 \delta_{max}$.

A predicted value of the normalized average difference signal level $\Delta \hat{S}_{norm}$ is calculated (Block 66), preferably according to the following relationship:

$$\Delta \hat{S}_{norm} = \sum_{i=1}^{m} \gamma_i \Delta S_{norm}^{t-i} \qquad \text{[Eq. 19]}$$

where $\Delta \hat{S}_{norm}$ = predicted average difference signal level normalized to maximum expected difference signal level, $\Upsilon_i$ = a scaling factor, $\Delta S_{norm}^{t-i}$ = $i^{th}$ past sample of normalized average difference signal level, and m = number of samples.

In the preferred embodiment, it has been found sufficient for the needs of a wireless telephone application to employ a value of 4 for the number of samples m, and to employ predetermined constants for the values of scaling factors $\Upsilon_i$.

A prediction error parameter $E_t$ is calculated, preferably according to the expression:

$$E_t = 10\log_{10}\frac{\Delta S_{norm}^2}{(\Delta S_{norm} - \Delta \hat{S}_{norm})^2} \qquad \text{[Eq. 20]}$$
$$= K_2(\log_2 \Delta S_{norm} - \log_2[\Delta S_{norm} - \Delta \hat{S}_{norm}])$$

where $K_2 = 20\log_{10}2$.

$E_t$ is compared with a predetermined threshold value (Block 70) to generate a logic output signal reflecting that comparison; the logic output value has a first value when $E_t$ exceeds the predetermined threshold value, thereby indicating the presence of speech in incoming signal s; and the logic output signal has a second value when $E_t$ is less than the predetermined threshold, thereby indicating the presence of noise in incoming signal s (Block 72). Thus, incoming signal s is muted by a muting device when the logic output signal indicates the presence of noise in incoming signal s (Block 74). When the logic output signal indicates the presence of speech in incoming signal s, the muting device effects no muting of incoming signal s (Block 76).

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

We claim:

1. A method for discriminating and suppressing noise within an incoming signal, the method comprising the steps of:

(a) generating a first iteration signal, said first iteration signal being representative of average signal level of said incoming signal, said first iteration signal being generated according to the relationship:

$$\delta_t = \sum_{i=1}^{n} |s_i|$$

where $\delta_t$ = average signal level, $|S_i|$ = magnitude of signal level of the $i^{th}$ sample of said incoming signal, and n = number of samples;

(b) generating a second iteration signal, said second iteration signal being representative of said first iteration signal normalized with respect to a maximum signal level expected of said incoming signal;

(c) providing a prediction means and using said prediction means for generating a predicted value for said second iteration signal from a plurality of earlier samples of said second iteration signal, said prediction means comprising a digital filter, said digital filter having at least as many taps as samples in said plurality of earlier samples;

(d) determining a difference between said second iteration signal and said predicted value to generate a prediction error signal;

(e) generating a control signal, said control signal having a first value when said prediction error signal exceeds a predetermined threshold value, said control signal having a second value when said prediction error does not exceed said threshold value; and (f) providing a muting means for muting signals; said muting means being operatively connected to receive said incoming signal and said control signal, said muting means responding to said control signal to mute said incoming signal when said control signal is at one of said first value and said second value, said muting means responding to said control signal to not mute said incoming signal when said control signal is at the other of said first value and said second value, whereby the first value is used to determine muting and the second value is used to determine not muting when the prediction error is not inversed and the second value is used to determine muting and the first value is used to determine not muting when the prediction value is inversed.

2. A method for discriminating and suppressing noise within an incoming signal as recited in claim 1 wherein said second iteration signal is generated according to the relationship:

$$S_{norm} = K(\log_2 \delta_t - K_1),$$

where
$S_{norm}$=average signal level normalized with respect to maximum signal level,
$K = 10\log_{10}2$,
$K_1 = \log_2 \delta_{max}$,
$\delta_t$=average signal level, and
$\delta_{max}$=maximum signal level.

3. A method for discriminating and suppressing noise within an incoming signal as recited in claim 1 wherein said predicted value is generated according to the relationship:

$$\hat{S}_{norm} = \sum_{i=1}^{m} \gamma_i S_{norm}^{t-i}$$

where
$\hat{S}_{norm}$=predicted average signal level normalized to maximum expected signal level of said incoming signal,
$Y_i$=a scaling factor,
$S_{norm}^{t-i}$=$i^{th}$ past sample of normalized average signal level, and
m=number of samples.

4. A method for discriminating and suppressing noise within an incoming signal as recited in claim 2 wherein said predicted value is generated according to the relationship:

$$\hat{S}_{norm} = \sum_{i=1}^{m} \gamma_i S_{norm}^{t-i}$$

where $\hat{S}_{norm}$=predicted average signal level normalized to maximum expected signal level of said incoming signal,
$Y_i$=a scaling factor,
$S_{norm}^{t-i}$=past sample of normalized average signal level, and
m=number of samples.

5. An apparatus for discriminating and suppressing noise within an incoming signal, the apparatus comprising:

a first signal processing means for processing said incoming signal to generate a first iteration signal, said first iteration signal representing average signal level of said incoming signal, said first signal processing means effecting an averaging algorithm in the form:

$$\delta_t = \sum_{i=1}^{n} |s_i|$$

where
$\delta_t$=average signal level,
$|S_i|$=magnitude of signal level of the $i^{th}$ sample of said incoming signal, and
n=number of samples;

a second signal processing means for processing said first iteration signal to generate a second iteration signal, said second iteration signal being representative of specified aspects of said first iteration signal;

a prediction means for generating a predicted value for said second iteration signal from a plurality of earlier samples of said second iteration signal, said prediction means comprising a digital filter, said digital filter having at least as many taps as samples in said plurality of earlier samples;

a logic means for determining a difference between said second iteration signal and said predicted value, to generate a prediction error signal, said logic means generating a logic output, said logic output having a first value when said prediction error signal exceeds a predetermined threshold value, said logic output having a second value when said prediction error signal does not exceed said threshold value; and a muting means for muting signals; said muting means being operatively connected to receive said incoming signal and said logic output, said muting means responding to said logic output to mute said incoming signal when said logic output is at one of said first value and said second value, said muting means responding to said logic output to not mute said incoming signal when said logic output is at the other of said first value and said second value, whereby the first value is used to determine muting when the prediction error is not inversed and the second value is used to determine muting when the prediction value is inversed.

6. An apparatus for discriminating and suppressing noise within an incoming signal as recited in claim 5 wherein said second iteration signal comprises said first iteration signal normalized with respect to the maximum value expected for said first iteration signal, said second signal processing means effecting a normalizing algorithm in the form:

$$S_{norm} = K(\log_2 \delta_t - K_1)$$

where
- $S_{norm}$ = average signal level normalized with respect to maximum signal level,
- $K = 10\log_{10} 2$,
- $K_1 = \log_2 \delta_{max}$,
- $\delta_t$ = average signal level, and
- $\delta_{max}$ = maximum signal level.

7. An apparatus for discriminating and suppressing noise within an incoming signal as recited in claim 5 wherein said predicted value is generated according to the relationship:

$$\hat{S}_{norm} = \sum_{i=1}^{m} \gamma_i S_{norm}^{t-i}$$

where
- $\hat{S}_{norm}$ = predicted average signal level normalized to maximum expected signal,
- $Y_i$ = a scaling factor,
- $S_{norm}^{t-i}$ = $i^{th}$ past sample of a normalized average signal level, and
- m = number of samples.

8. An apparatus for discriminating and suppressing noise within an incoming signal as recited in claim 6 wherein said predicted value is generated according to the relationship:

$$\hat{S}_{norm} = \sum_{i=1}^{m} \gamma_i S_{norm}^{t-i}$$

where
- $\hat{S}_{norm}$ = predicted average signal level normalized to maximum expected signal level of said incoming signal,
- $Y_i$ = a scaling factor,
- $S_{norm}^{t-i}$ = $i^{th}$ past sample of normalized average signal level, and
- m = number of samples.

9. A method for discriminating and suppressing noise within an incoming signal, the method comprising the steps of:

(a) generating a first iteration signal, said first iteration signal being representative of an average difference between a first sample of signal level of said incoming signal and a delayed sample of signal level of said incoming signal, said first iteration signal being generated according to the relationship:

$$\Delta_t = \sum_{i=1}^{n} |s_i - s_{i-1}|$$

where
- $\Delta_t$ = average difference signal level,
- $|S_i - S_{i-1}|$ = magnitude of difference between signal level of a first ($i^{th}$) sample of said incoming signal and signal level of a delayed $(i-1)^{th}$ sample of said incoming signal, and
- n = number of samples;

(b) generating a second iteration signal, said second iteration signal being representative of said first iteration signal normalized with respect to a maximum difference signal level expected of said average difference signal;

(c) providing a prediction means and using said prediction means for generating a predicted value for said second iteration signal from a plurality of earlier samples of said second iteration signal, said prediction means comprising a digital filter, said digital filter having at least as many taps as samples in said plurality of earlier samples;

(d) determining a threshold difference between said second iteration signal and said predicted value to generate a prediction error signal;

(e) generating a control signal, said control signal having a first value when said prediction error signal exceeds a predetermined threshold value, said control signal having a second value when said prediction error signal does not exceed said threshold value; and (f) providing a muting means for muting signals; said muting means being operatively connected to receive said incoming signal and said control signal, said muting means responding to said control signal to mute said incoming signal when said control signal is at one of said first value and said second value, said muting means responding to said control signal to not mute said incoming signal when said control signal is at the other of said first value and said second value, whereby the first value is used to determine muting and the second value is used to determine not muting when the prediction error is not inversed and the second value is used to determine muting and the first value is used to determine not muting when the prediction value is inversed.

10. A method for discriminating and suppressing noise within an incoming signal as recited in claim 9 wherein said second iteration signal is generated according to the relationship:

$$\Delta S_{norm} = K(\log_2 \Delta_t - K_1)$$

where
- $\Delta S_{norm}$ = average difference signal level normalized with respect to maximum difference signal level,
- $K = 10\log_{10} 2$,
- $K_1 = \log_2 \Delta_{max}$,
- $\Delta_t$ = average difference signal level, and
- $\Delta_{max}$ = maximum difference signal level.

11. A method for discriminating and suppressing noise within an incoming signal as recited in claim 9 wherein said predicted value is generated according to the relationship:

$$\Delta \hat{S}_{norm} = \sum_{i=1}^{m} \gamma_i \Delta S_{norm}^{t-i}$$

where
- $\Delta \hat{S}_{norm}$ = predicted average difference signal level normalized to maximum expected difference signal level,
- $Y_i$ = a scaling factor,
- $\Delta S_{norm}^{t-i}$ = $i^{th}$ past sample of normalized average difference signal level, and
- m = number of samples.

12. A method for discriminating and suppressing noise within an incoming signal as recited in claim 10 wherein said predicted value is generated according to the relationship:

$$\hat{S}_{norm} = \sum_{i=1}^{m} \gamma_i \Delta S_{norm}^{t-i}$$

where
$\Delta \hat{S}_{norm}$ = predicted average difference signal level normalized to maximum expected difference signal level,
$Y_i$ = a scaling factor,
$\Delta S_{norm}^{t-i}$ = $i^{th}$ past sample of normalized average difference signal level, and
m = number of samples.

13. An apparatus for discriminating and suppressing noise within an incoming signal, the apparatus comprising:
a first signal processing means for processing said incoming signal to generate a first iteration signal, said first iteration signal representing an average difference between a first sample of signal level of said incoming signal and a delayed sample of signal level of said incoming signal, said first signal processing means effecting an averaging algorithm in the form:
where $\Delta_t$ = average difference signal level, $$\Delta_t = \sum_{i=1}^{n} |s_i - s_{i-1}|$$

$|S_i - S_{i-1}|$ = magnitude of difference between signal level of a first ($i^{th}$) sample of said incoming signal and signal level of a delayed $(i-1)^{th}$ sample of said incoming signal, and
n = number of samples;
a second signal processing means for processing said first iteration signal to generate a second iteration signal, said second iteration signal being representative of specified aspects of said first iteration signal;
a prediction means for generating a predicted value for said second iteration signal from a plurality of earlier samples of said second iteration signal, said prediction means comprising a digital filter, said digital filter having at least as many taps as samples in said plurality of earlier samples;
a logic means for determining a threshold difference between said second iteration signal and said predicted value to generate a prediction error signal, said logic means generating a logic output, said logic output having a first value when said prediction error signal exceeds a predetermined threshold value, said logic output having a second value when said prediction error signal does not exceed said threshold value; and
a muting means for muting signals; said muting means being operatively connected to receive said incoming signal and said logic output, said muting means responding to said logic output to mute said incoming signal when said logic output is at one of said first value and said second value, said muting means responding to said logic output to not mute said incoming signal when said logic output is at the other of said first value and said second value, whereby the first value is used to determined muting and the second value is used to determine not muting when the prediction error is not inversed and the second value is used to determine muting and the first value is used to determine not muting when the prediction value is inversed.

14. An apparatus for discriminating and suppressing noise within an incoming signal as recited in claim 13 wherein said second iteration signal comprises said first iteration signal normalized with respect to the maximum value expected for said first iteration signal, said second signal processing means effecting a normalizing algorithm in the form:

$$\Delta S_{norm} = K(\log_2 \Delta_t - K_1)$$

where
$\Delta S_{norm}$ = average difference signal level normalized with respect to maximum difference signal level,
$K = 10\log_{10} 2$,
$K_1 = \log_2 \Delta_{max}$,
$\Delta_t$ = average difference signal level, and
$\Delta_{max}$ = maximum difference signal level.

15. An apparatus for discriminating and suppressing noise within an incoming signal as recited in claim 13 wherein said predicted value is generated according to the relationship:

$$\hat{S}_{norm} = \sum_{i=1}^{m} \gamma_i \Delta S_{norm}^{t-i}$$

where
$\Delta \hat{S}_{norm}$ = predicted average difference signal level normalized to maximum expected difference signal level,
$Y_i$ = a scaling factor,
$\Delta S_{norm}^{t-i}$ = $i^{th}$ past sample of normalized average difference signal level, and
m = number of samples.

16. An apparatus for discriminating and suppressing noise within an incoming signal as recited in claim 14 wherein said predicted value is generated according to the relationship:

$$\hat{S}_{norm} = \sum_{i=1}^{m} \gamma_i \Delta S_{norm}^{t-i}$$

where
$\Delta \hat{S}_{norm}$ = predicted average difference signal level normalized to maximum expected difference signal level,
$Y_i$ = a scaling factor,
$\Delta S_{norm}^{t-i}$ = $i^{th}$ past sample of normalized average difference signal level, and
m = number of samples.

* * * * *